US010958273B2

(12) United States Patent
Ikeura et al.

(10) Patent No.: US 10,958,273 B2
(45) Date of Patent: Mar. 23, 2021

(54) CIRCUIT DEVICE, CIRCUIT REWRITING METHOD, AND COMPUTER-READABLE RECORDING MEDIUM

(71) Applicant: NEC Solution Innovators, Ltd., Tokyo (JP)

(72) Inventors: Kiyoshi Ikeura, Tokyo (JP); Yasuhito Motoi, Tokyo (JP)

(73) Assignee: NEC Solution Innovators, Ltd., Tokyo (JP)

( * ) Notice: Subject to any disclaimer, the term of this patent is extended or adjusted under 35 U.S.C. 154(b) by 127 days.

(21) Appl. No.: 16/096,364

(22) PCT Filed: Apr. 27, 2017

(86) PCT No.: PCT/JP2017/016865
§ 371 (c)(1),
(2) Date: Oct. 25, 2018

(87) PCT Pub. No.: WO2017/188416
PCT Pub. Date: Nov. 2, 2017

(65) Prior Publication Data
US 2019/0140650 A1    May 9, 2019

(30) Foreign Application Priority Data
Apr. 28, 2016   (JP) .............................. JP2016-090727

(51) Int. Cl.
*H03K 19/17756*    (2020.01)
*G06F 11/00*    (2006.01)
(Continued)

(52) U.S. Cl.
CPC . *H03K 19/17756* (2013.01); *G05B 19/41865* (2013.01); *G06F 11/00* (2013.01); *G06F 30/34* (2020.01)

(58) Field of Classification Search
CPC ... H03K 19/17756; G06F 30/34; G06F 11/00; G06F 30/39; G05B 19/41865
See application file for complete search history.

(56) References Cited

U.S. PATENT DOCUMENTS 5,784,313 A * 7/1998 Trimberger ...... H03K 19/17752
365/182
6,020,758 A * 2/2000 Patel ................ H03K 19/17752
326/38
(Continued)

FOREIGN PATENT DOCUMENTS

JP    2003-208305 A    7/2003
JP    2010-074461 A    4/2010
(Continued)

OTHER PUBLICATIONS

International Search Report in corresponding International Application No. PCT/JP2017/016865, dated Jul. 25, 2017.
(Continued)

*Primary Examiner* — Nha T Nguyen

(57) ABSTRACT

A circuit device (10) includes a circuit construction unit (20) having logic circuit deployment areas (21) and (22) in which a logic circuit can be deployed, and a circuit controller (30) configured to deploy a designated logic circuit in a logic circuit deployment area, in which, if a logic circuit that is deployed in one of the logic circuit deployment areas is instructed to be rewritten to a new logic circuit, the circuit controller (30) deploys the new logic circuit in the other logic circuit deployment area, and, after deployment of the new logic circuit has ended, stops operation of the logic circuit that was initially deployed in the one of the logic circuit deployment areas.

3 Claims, 7 Drawing Sheets

(51) Int. Cl.
*G06F 30/34* (2020.01)
*G05B 19/418* (2006.01)

(56) References Cited

U.S. PATENT DOCUMENTS

| | | | | |
|---|---|---|---|---|
| 6,384,627 | B1* | 5/2002 | Fross | G06F 7/02 326/38 |
| 7,124,391 | B1* | 10/2006 | Patterson | G06F 30/34 716/117 |
| 7,454,546 | B1* | 11/2008 | Lilley | G06F 13/1605 710/117 |
| 7,518,396 | B1* | 4/2009 | Kondapalli | H03K 19/17758 326/38 |
| 7,525,343 | B1* | 4/2009 | Neuendorffer | H03K 19/17748 326/38 |
| 7,541,833 | B1* | 6/2009 | Neuendorffer | H03K 19/17756 326/38 |
| 7,546,572 | B1* | 6/2009 | Ballagh | H03K 19/17732 716/138 |
| 7,941,777 | B1* | 5/2011 | Young | G06F 30/34 716/126 |
| 8,122,239 | B1* | 2/2012 | James-Roxby | H03K 19/177 713/100 |
| 8,352,898 | B1* | 1/2013 | Kellermann | G06F 30/34 716/117 |
| 8,402,409 | B1* | 3/2013 | Janneck | G06F 8/30 716/117 |
| 8,719,750 | B1* | 5/2014 | Balzli, Jr. | G06F 30/394 716/113 |
| 8,786,310 | B1* | 7/2014 | Lu | H03K 19/1776 326/41 |
| 8,910,109 | B1* | 12/2014 | Orthner | G06F 30/34 716/139 |
| 8,997,033 | B1* | 3/2015 | Hew | G06F 30/34 716/116 |
| 9,203,408 | B1* | 12/2015 | Peng | H03K 19/17756 |
| 9,425,802 | B1* | 8/2016 | Xiao | H03K 19/1776 |
| 9,503,094 | B1* | 11/2016 | Munday | G06F 9/5077 |
| 9,584,129 | B1* | 2/2017 | Walstrom | H03K 19/17756 |
| 10,084,452 | B2* | 9/2018 | Obayashi | H03K 19/17758 |
| 10,216,555 | B2* | 2/2019 | Chiou | G06F 11/3003 |
| 10,242,146 | B2* | 3/2019 | Goldman | G06F 30/394 |
| 2013/0007687 | A1* | 1/2013 | Mendel | G06F 30/34 716/117 |
| 2013/0027080 | A1* | 1/2013 | Sugiyama | H03K 19/17756 326/41 |
| 2015/0263735 | A1* | 9/2015 | Kurokawa | H03K 19/17756 326/38 |
| 2015/0373225 | A1* | 12/2015 | Tanaka | H04N 1/32609 358/474 |
| 2016/0342722 | A1* | 11/2016 | Sentieys | G06F 30/34 |
| 2017/0169882 | A1* | 6/2017 | Matsumura | G06F 15/8007 |
| 2017/0201255 | A1* | 7/2017 | Wang | H04L 49/109 |
| 2017/0244414 | A1* | 8/2017 | Niu | H03K 19/17752 |
| 2018/0081671 | A1* | 3/2018 | Naruse | B60R 16/0231 |
| 2018/0175861 | A1* | 6/2018 | Yin | H03K 19/17744 |

FOREIGN PATENT DOCUMENTS

| | | |
|---|---|---|
| JP | 2013-009044 A | 1/2013 |
| JP | 2014138382 A | 7/2014 |

OTHER PUBLICATIONS

"Vivado Design Suite User Guide", Nov. 18, 2015, Xilinx, <URL http://japan.xilinx.com/support/documentation/sw_manuals_j/xilinx2015_4/ug909-vivado-partial-reconfiguration.pdf> (205 pages total).

Japanese Office Action for JP Application No. 2018-514724 dated Dec. 3, 2019 with English Translation.

Japanese Office Action for JP Application No. 2020-012726 dated Dec. 22, 2020 with English Translation.

* cited by examiner

US 10,958,273 B2

CIRCUIT DEVICE, CIRCUIT REWRITING METHOD, AND COMPUTER-READABLE RECORDING MEDIUM

This application is a National Stage Entry of PCT/JP2017/016865 filed on Apr. 27, 2017, which claims priority from Japanese Patent Application 2016-090727 filed on Apr. 28, 2016, the contents of all of which are incorporated herein by reference, in their entirety.

TECHNICAL FIELD

The present invention relates to a circuit device in which a logic circuit is rewritable, a circuit rewriting method using the circuit device, and a computer-readable recording medium in which a program for realizing these is recorded.

BACKGROUND ART

An FPGA (Field Programmable Gate Array) is an integrated circuit that can be freely programmed by a user. In recent years, FPGAs have been adopted in various electronic devices such as digital cameras, camcorders, and hard disk recorders because of that characteristic.

Specifically, the FPGA includes a plurality of logic blocks, and various logic circuits can be constituted by electrically connecting the logic blocks in accordance with a program. Also, a portion of the logic circuit can be dynamically rewritten (partial reconfiguration) in the FPGA, and thus the FPGA can support changes in the specifications of electronic devices into which the FPGA is incorporated.

For example, Non-Patent Document 1 discloses an FPGA including a static area in which a non-rewritable logic circuit is constructed and a reconfigurable area in which a rewritable logic circuit is constructed. With the FPGA disclosed in Non-Patent Document 1, the logic circuit in the reconfigurable area can be rewritten by loading a file in which the circuit configuration is written.

LIST OF PRIOR ART DOCUMENTS

Non-Patent Document

Non-Patent Document 1: "Vivado Design Suite User Guide", "online", Nov. 18, 2015, Xilinx, Retrieved on Apr. 1, 2016.

DISCLOSURE OF THE INVENTION

Problems to be Solved by the Invention

However, with the FPGA disclosed in Non-Patent Document 1, in order to rewrite the current logic circuit that is constructed in the reconfigurable area to a new logic circuit, it is necessary, first, to stop the current logic circuit temporarily, and thereafter, to reconstruct the new logic circuit. Thus, the FPGA disclosed in Non-Patent Document 1 is problematic in that processing cannot be executed while the logic circuit is being rewritten.

An example of an object of the present invention is to solve the above-described problems and provide a circuit device, a circuit rewriting method, and a computer-readable recording medium that can execute rewriting of a logic circuit without stopping processing in an FPGA.

Means for Solving the Problems

In order to achieve the above-described object, a first circuit device in an aspect of the present invention includes:

a circuit construction unit having at least two areas in which a logic circuit can be deployed; and a circuit controller configured to deploy a designated logic circuit in the areas, in which, if a logic circuit that is deployed in one of the areas is instructed to be rewritten to a new logic circuit, the circuit controller deploys the new logic circuit in another of the areas, and, after deployment of the new logic circuit has ended, stops operation of the logic circuit that was initially deployed in the one of the areas.

In order to achieve the above-described object, a second circuit device in an aspect of the present invention includes:

a circuit construction unit having an area in which a logic circuit can be deployed; and a circuit controller configured to deploy a designated logic circuit in the area, in which, if the logic circuit that is deployed in the area is instructed to be rewritten to a new logic circuit, the circuit controller executes processing to be executed by the logic circuit that was initially deployed, instead of the logic circuit that was initially deployed, and also deploys the new logic circuit in the area, and, after deployment of the new logic circuit has ended, stops executing the processing.

Also, in order to achieve the above-described object, a first circuit rewriting method in an aspect of the present invention is a method using a circuit device having at least two areas in which a logic circuit can be deployed, the method including:

(a) a step, by a processor of the circuit device, of deploying a designated logic circuit in the areas; and (b) a step, by the processor, of, if a logic circuit that is deployed in one of the areas is instructed to be rewritten to a new logic circuit, deploying the new logic circuit in another of the areas, and, after deployment of the new logic circuit has ended, stopping operation of the logic circuit that was initially deployed in the one of the areas.

Also, in order to achieve the above-described object, a second circuit rewriting method in an aspect of the present invention is a method using a circuit device having an area in which a logic circuit can be deployed, the method including:

(a) a step, by a computer of the circuit device, of deploying a designated logic circuit in the area; and (b) a step, by the computer, of, if the logic circuit that is deployed in the area is instructed to be rewritten to a new logic circuit, executing processing to be executed by the logic circuit that was initially deployed, instead of the logic circuit that was initially deployed, and also deploying the new logic circuit in the area, and, after deployment of the new logic circuit has ended, stopping executing the processing.

Furthermore, in order to achieve the above-described object, a first computer-readable recording medium in an aspect of the present invention stores a program including a command for causing a computer that is provided in a circuit device having at least two areas in which a logic circuit can be deployed to execute:

(a) a step of deploying a designated logic circuit in the areas; and (b) a step of, if a logic circuit that is deployed in one of the areas is instructed to be rewritten to a new logic circuit, deploying the new logic circuit in another of the areas, and, after deployment of the new logic circuit has ended, stopping operation of the logic circuit that was initially deployed in the one of the areas.

Furthermore, in order to achieve the above-described object, a second computer-readable recording medium in an aspect of the present invention stores a program including a command for causing a computer that is provided in a circuit device having an area in which a logic circuit can be deployed to execute:
(a) a step of deploying a designated logic circuit in the area; and
(b) a step of, if the logic circuit that is deployed in the area is instructed to be rewritten to a new logic circuit, executing processing to be executed by the logic circuit that was initially deployed, instead of the logic circuit that was initially deployed, and also deploying the new logic circuit in the area, and, after deployment of the new logic circuit has ended, stopping executing the processing.

Advantageous Effects of the Invention

As described above, according to the present invention, it is possible to execute rewriting of a logic circuit without stopping processing in an FPGA.

MODE FOR CARRYING OUT THE INVENTION

Embodiment 1

Figure 1:
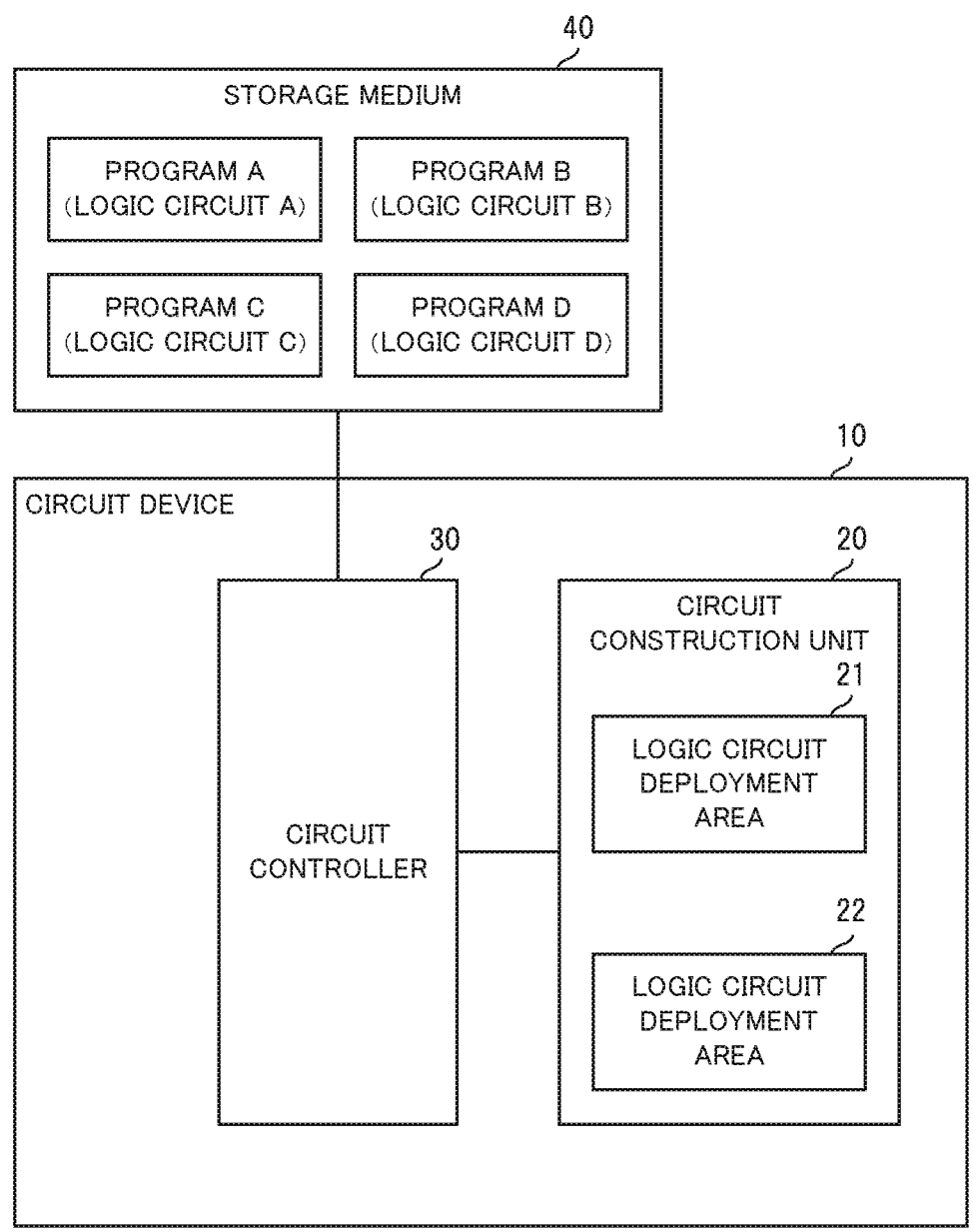
FIG. 1 is a block diagram showing a configuration of a circuit device in Embodiment 1 of the present invention.
Figure 2:
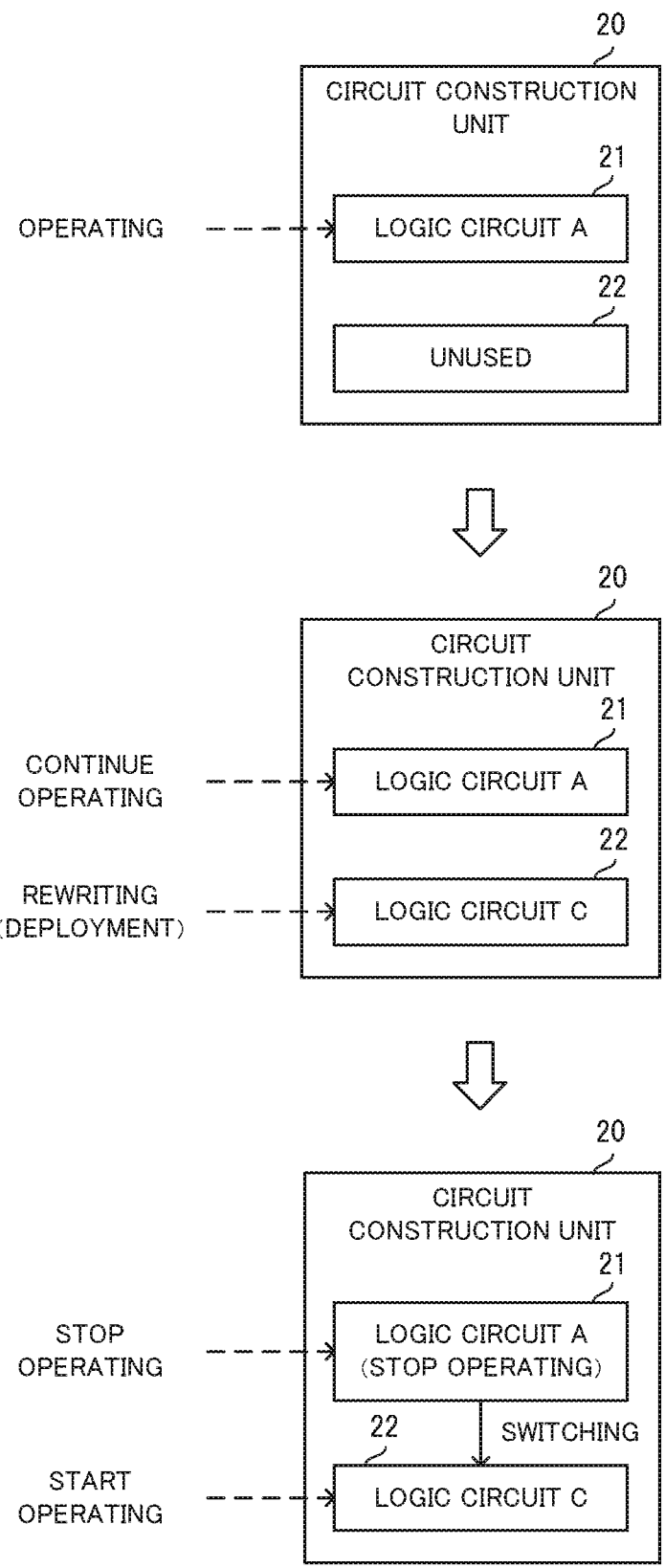
FIG. 2 is a diagram showing functions of the circuit device in Embodiment 1 of the present invention.

Hereinafter, a circuit device, a circuit rewriting method, and a program in Embodiment 1 of the present invention will be described with reference to FIGS. 1 to 3.
Device Configuration
First, a configuration of a circuit device in Embodiment 1 will be described with reference to FIG. 1. FIG. 1 is a block diagram showing a configuration of a circuit device in Embodiment 1 of the present invention.
A circuit device 10 in Embodiment 1 shown in FIG. 1 is an FPGA (Field Programmable Gate Array), which is an integrated circuit that can be freely programmed by a user. As shown in FIG. 1, the circuit device 10 includes a circuit construction unit 20 and a circuit controller 30.
The circuit construction unit 20 has at least two areas ("logic circuit deployment area" hereinafter) in which a logic circuit can be deployed. Note that two logic circuit deployment areas 21 and 22 are shown in an example of FIG. 1.
The circuit controller 30 deploys a designated logic circuit in the logic circuit deployment area 21 or 22. Also, if the logic circuit that is deployed in one of the logic circuit deployment areas 21 and 22 is instructed to be rewritten to a new logic circuit, the circuit controller 30 deploys the new logic circuit in the other logic circuit deployment area.

Furthermore, after deployment of the new logic circuit has ended, the circuit controller 30 stops operation of the logic circuit that was initially deployed in one of the logic circuit deployment areas.
If it is necessary to dynamically rewrite a logic circuit in this manner, it is possible to construct a new logic circuit before stopping an existing logic circuit in Embodiment 1. That is, according to Embodiment 1, it is possible to execute rewriting of a logic circuit without stopping processing in an FPGA.
Here, a configuration and functions of the circuit device in Embodiment 1 will be described with reference to FIG. 2, in addition to FIG. 1. FIG. 2 is a diagram showing the functions of the circuit device in Embodiment 1 of the present invention. Note that only the circuit construction unit 20 is illustrated in FIG. 2 for the purpose of description.
As shown in FIG. 1, in the present embodiment, in the circuit device 10, the circuit controller 30 reads out a program for deploying a logic circuit from a recording medium 40, executes the read program, and thereby deploys a logic circuit in the logic circuit deployment area. Also, in FIG. 1, a program A deploys a logic circuit A, a program B deploys a logic circuit B, a program C deploys a logic circuit C, and a program D deploys a logic circuit D.
Also, as shown in an upper diagram in FIG. 2, it is assumed that if the logic circuit A is deployed in the logic circuit deployment area 21 and the logic circuit deployment area 22 is not in use, the logic circuit A is instructed to be rewritten to the logic circuit C.
In this case, as shown in a middle diagram in FIG. 2, in a state in which the logic circuit A continues to operate, the circuit controller 30 reads out the program C from the recording medium 40, executes the read program C, and thereby deploys the logic circuit C in the logic circuit deployment area 22. Accordingly, the circuit construction unit 20 is in a state in which both the logic circuits A and C are deployed.
Subsequently, as shown in a lower diagram in FIG. 2, when deployment of the logic circuit C has ended, the circuit controller 30 stops operation of the logic circuit A and starts operation of the logic circuit C instead. As a result, the logic circuit A is seamlessly switched to the logic circuit C, and the occurrence of a time period during which the logic circuit stops operating is suppressed.
Device Operations
Next, operations of the circuit device 10 in Embodiment 1 of the present invention will be described with reference to FIG. 3. FIG. 3 is a flowchart showing operations of the circuit device in Embodiment 1 of the present invention. In the following description, FIGS. 1 and 2 will be referred to as appropriate. Also, in Embodiment 1, a circuit rewriting method is implemented by operating the circuit device 10. Thus, a description of the circuit rewriting method in Embodiment 1 will be replaced with the description of the operations of the circuit device 10 below.
First, it is presumed that the circuit controller 30 has read out, from the recording medium 40, a program for deploying one of the logic circuits, and executed this program, and that a logic circuit is thereby deployed in one of the logic circuit deployment areas.
As shown in FIG. 3, first, the circuit controller 30 receives an instruction to rewrite the logic circuit (step A1).
Next, the circuit controller 30 reads out, from the recording medium 40, a program for deploying a new logic circuit to which the logic circuit is instructed to be rewritten (step A2).

Next, the circuit controller 30 executes the program that was read out in step A2, and deploys the new logic circuit in an unused logic circuit deployment area (step A3).

Thereafter, when confirmed that deployment of the new logic circuit has ended, the circuit controller 30 stops the operation of logic circuit that was initially deployed, and causes the new logic circuit to operate (step A4).

As described above, according to Embodiment 1, one logic circuit is seamlessly switched to another logic circuit, and the occurrence of a time period during which the logic circuit stops operating is suppressed, and thus rewriting of the logic circuit can be executed without stopping processing.

Program

Figure 3:
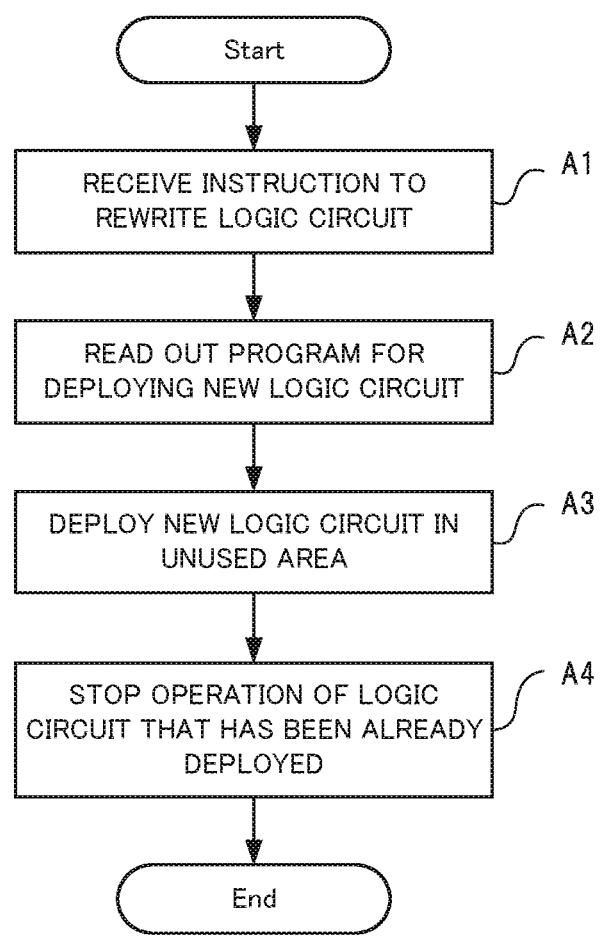
FIG. 3 is a flowchart showing operations of the circuit device in Embodiment 1 of the present invention.

The program in Embodiment 1 may be a program for causing a computer to execute steps A1 to A4 shown in FIG. 3. This program is installed in the computer, and executed by the computer, and thereby the circuit device 10 and the circuit rewriting method in Embodiment 1 can be realized. In this case, a CPU (Central Processing Unit) of the computer functions as the circuit controller 30 and performs processing.

Embodiment 2

Next, a circuit device, a circuit rewriting method, and a program in Embodiment 2 of the present invention will be described with reference to FIGS. 4 to 6.

Device Configuration

First, a configuration of the circuit device in Embodiment 2 will be described with reference to FIG. 4. FIG. 4 is a block diagram showing a configuration of the circuit device in Embodiment 2 of the present invention.

Figure 4:
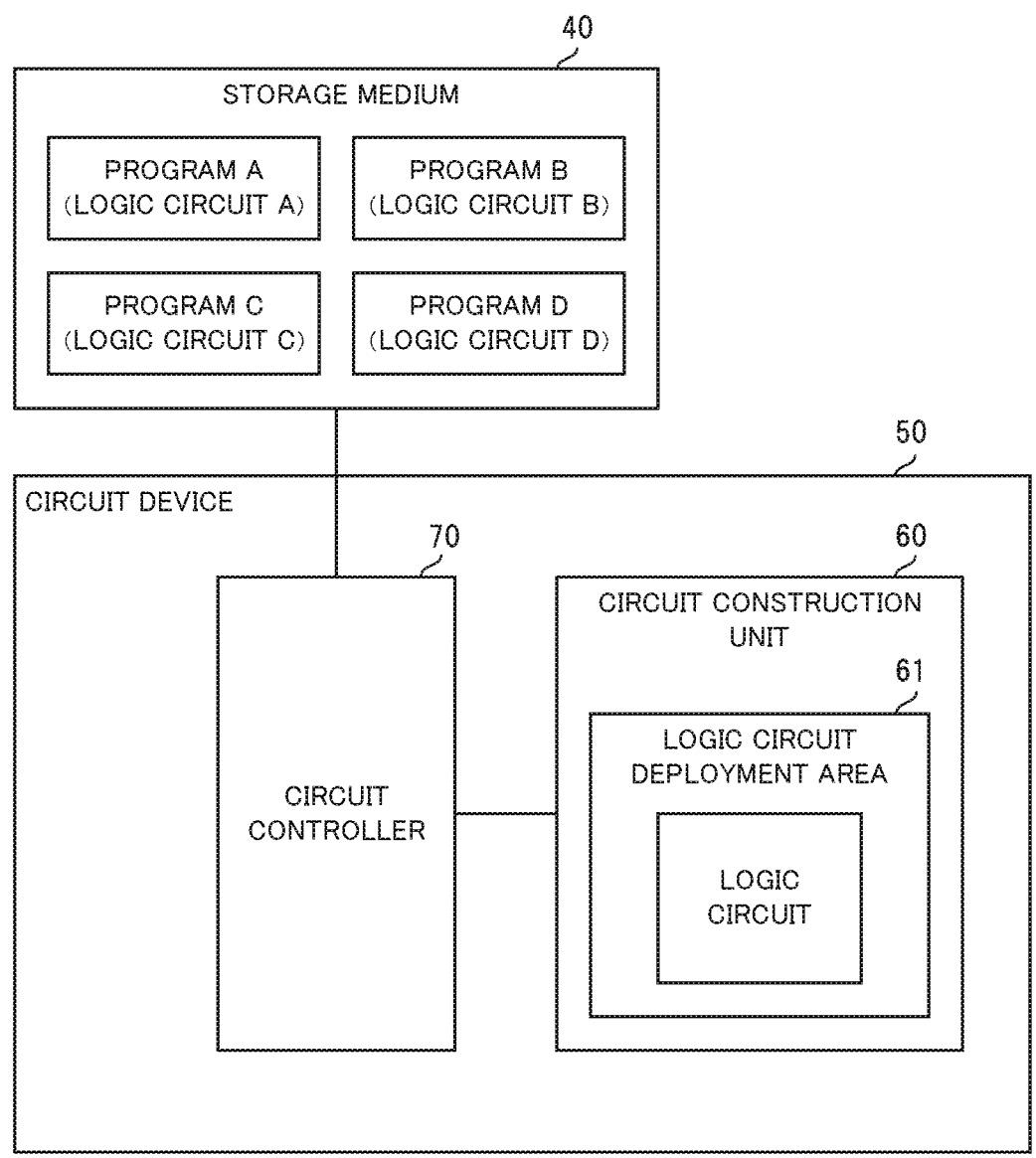
FIG. 4 is a block diagram showing a configuration of a circuit device in Embodiment 2 of the present invention.

Similarly to the circuit device 10 in Embodiment 1, a circuit device 50 in Embodiment 2 shown in FIG. 4 is also an FPGA (Field Programmable Gate Array), which is an integrated circuit that can be freely programmed by a user.

As shown in FIG. 4, similarly to the circuit device 10, the circuit device 50 also includes a circuit construction unit 60 and a circuit controller 70. Also, the circuit construction unit 60 has a logic circuit deployment area 61 in which a logic circuit can be deployed. Also, the circuit controller 70 reads out a program for deploying a logic circuit from a recording medium 40, executes the read program, and thereby deploys a logic circuit in the logic circuit deployment area.

However, Embodiment 2 is different from Embodiment 1 in the following respects. Hereinafter, differences from Embodiment 1 will be mainly described.

First, as shown in FIG. 4, in Embodiment 2, the circuit construction unit 60 has only one logic circuit deployment area 61, instead of having a plurality of the logic circuit deployment areas 61. Thus, if a logic circuit that is deployed in the logic circuit deployment area 61 is instructed to be rewritten to a new logic circuit, the circuit controller 70 operates as the logic circuit that has initially been deployed.

Specifically, the circuit controller 70 executes processing to be executed by this logic circuit and deploys the new logic circuit in a logic circuit deployment area, instead of the logic circuit that was initially deployed. After deployment of the new logic circuit has ended, the circuit controller 70 stops executing the processing to be executed by the logic circuit that was initially deployed.

Here, functions of the circuit device in Embodiment 2 will be described with reference to FIG. 5. FIG. 5 is a diagram showing the functions of the circuit device in Embodiment 2 of the present invention. Note that only the circuit construction unit 60 and the circuit controller 70 are illustrated in FIG. 5 for the purpose of description.

Figure 5:
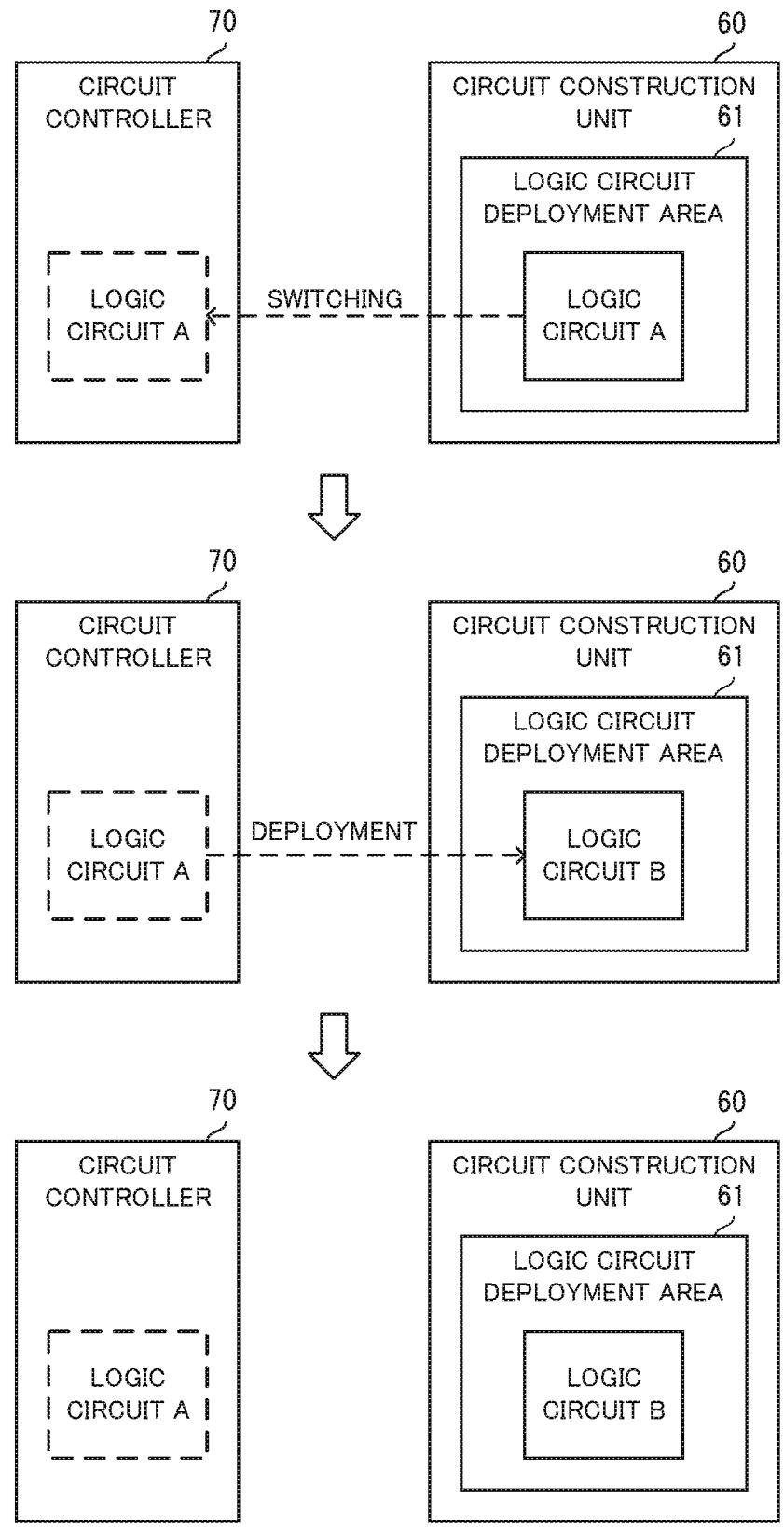
FIG. 5 is a diagram showing functions of the circuit device in Embodiment 2 of the present invention.

It is assumed that, as shown in an upper diagram in FIG. 5, when the logic circuit A is deployed in the logic circuit deployment area 61, the logic circuit A is instructed to be rewritten to the logic circuit B. In this case, the circuit controller 70 takes over processing from the logic circuit A, and starts the processing as the logic circuit A.

Next, as shown in a middle diagram in FIG. 5, the circuit controller 70 reads out a program B from the recording medium 40, executes the read program B, and deploys the logic circuit B in the logic circuit deployment area 61 while executing the processing as the logic circuit A. Also, the circuit controller 70 executes the processing as the logic circuit A while deploying the logic circuit B, and thus the processing of the logic circuit A is not suspended during this time.

Subsequently, as shown in a lower diagram in FIG. 5, when deployment of the logic circuit B has ended, the circuit controller 70 starts the operation of the logic circuit B and stops execution of the processing as the logic circuit A. As a result, the logic circuit A is seamlessly switched to the logic circuit B, and the occurrence of a time period during which the logic circuit stops operating is suppressed.

Device Operations

Next, operations of the circuit device 50 in Embodiment 2 of the present invention will be described with reference to FIG. 6. FIG. 6 is a flowchart showing operations of the circuit device in Embodiment 2 of the present invention. In the following description, FIGS. 4 and 5 will be referred to as appropriate. Also, in Embodiment 2, a circuit rewriting method is implemented by operating the circuit device 50. Thus, a description of the circuit rewriting method in Embodiment 2 will be replaced with the description of the operations of the circuit device 50 below.

First, it is presumed that the circuit controller 70 has read out, from the recording medium 40, a program for deploying one of the logic circuits, and executed this program, and that a logic circuit is thereby deployed in the logic circuit deployment area 61.

Figure 6:
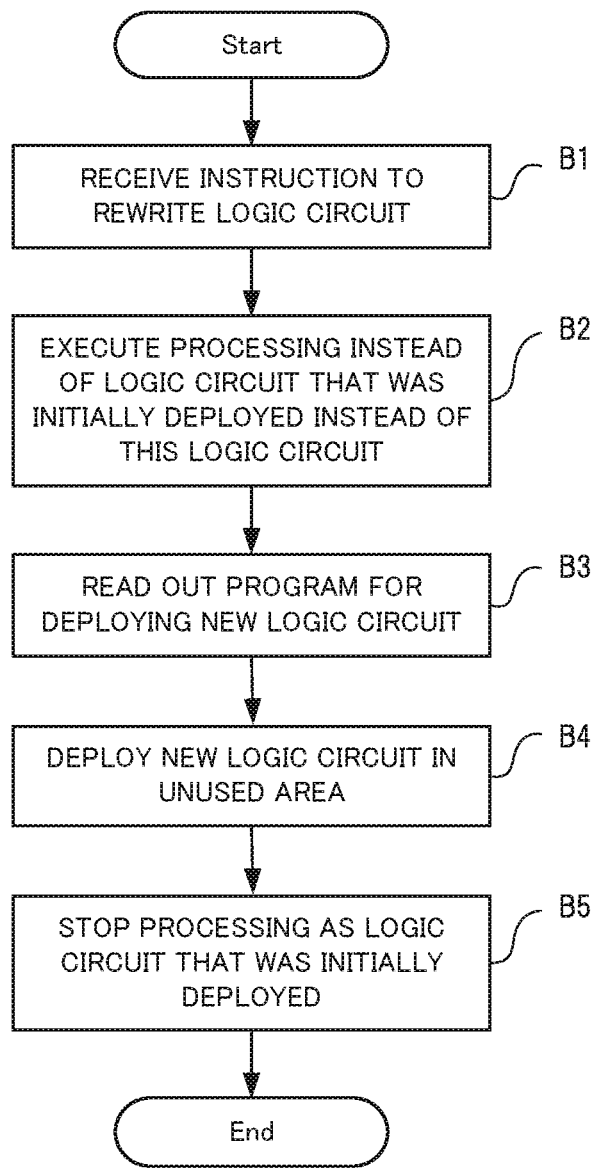
FIG. 6 is a flowchart showing operations of the circuit device in Embodiment 2 of the present invention.

As shown in FIG. 6, first, the circuit controller 70 receives an instruction to rewrite the logic circuit (step B1).

Next, the circuit controller 70 executes processing to be executed by the logic circuit that was initially deployed, instead of this logic circuit (step B2).

Next, the circuit controller 70 reads out, from the recording medium 40, a program for deploying the new logic circuit to which the logic circuit is instructed to be rewritten (step B3).

Next, the circuit controller 70 executes the program that was read out in step B3, and deploys the new logic circuit in the logic circuit deployment area 61 (step B4).

Thereafter, when confirmed that deployment of the new logic circuit has ended, the circuit controller 70 causes the new logic circuit to operate, and stops processing as the logic circuit that is being executed (step B5).

As described above, according to Embodiment 2, similarly to Embodiment 1, one logic circuit is seamlessly switched to another logic circuit, and the occurrence of a time period during which the logic circuit stops operating is suppressed, and thus rewriting of the logic circuit can be executed without stopping processing.

Program

The program in Embodiment 2 may be a program for causing a computer to execute steps B1 to B5 shown in FIG. 6. This program is installed in the computer, and executed by the computer, and thereby the circuit device 50 and the circuit rewriting method in Embodiment 2 can be realized. In this case, a CPU (Central Processing Unit) of the computer functions as the circuit controller 70 and performs processing.

Physical Configuration

Figure 7:
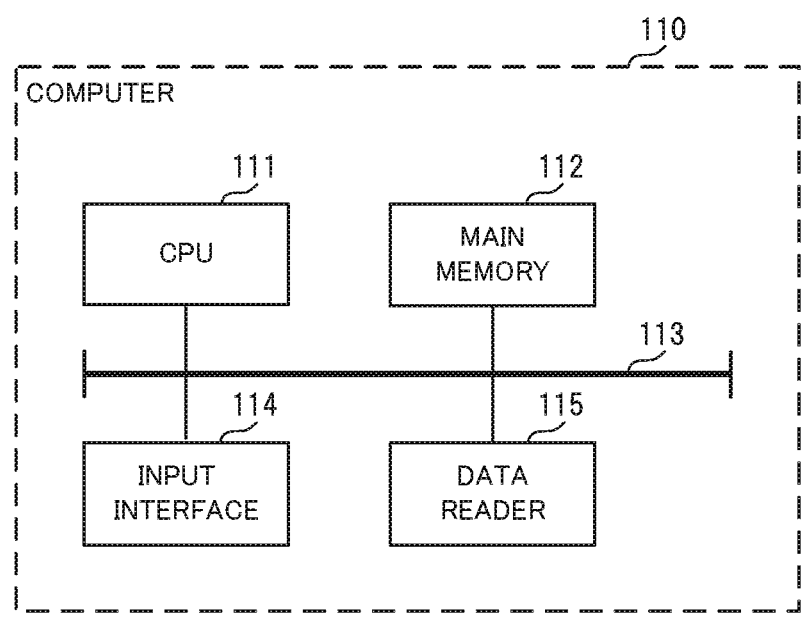
FIG. 7 is a block diagram showing one example of a computer for realizing the circuit devices in Embodiments 1 and 2 of the present invention.

Here, a computer configured to realize a circuit controller by executing the program in Embodiments 1 and 2 will be described with reference to FIG. 7. FIG. 7 is a block diagram showing one example of a computer for realizing the circuit device in Embodiments 1 and 2 of the present invention.

As shown in FIG. 7, a computer 110 includes a CPU 111, a main memory 112, an input interface 114, and a data reader 115. These units are connected via a bus 113 for data communication.

The CPU 111 loads programs (codes) in Embodiment 1 or 2 on the main memory 112, executes these programs in a predetermined order, and thereby implements various calculations. Typically, the main memory 112 is a volatile storage device such as a DRAM (Dynamic Random Access Memory). Also, the programs in these embodiments are provided in a state of being stored in the computer-readable recording medium. Note that the programs in these embodiments may be distributed on the Internet.

Also, the input interface 114 mediates data transmission between the CPU 111 and the outside. The data reader 115 mediates data transmission between the CPU 111 and the recording medium, and executes reading out of data from the recording medium.

Also, specific examples of the computer-readable recording medium include general-purpose semiconductor storage devices such as CF (Compact Flash (registered trademark)) and SD (Secure Digital), magnetic recording media such as Flexible Disk, and optical recording media such as CD-ROM (Compact Disk Read Only Memory).

Part or all of the above-described embodiments can be expressed by Additional Remarks 1 to 6 below, but are not limited thereto.

Supplementary Note 1

A circuit device comprising:

a circuit construction unit having at least two areas in which a logic circuit can be deployed; and a circuit controller configured to deploy a designated logic circuit in the areas, wherein, if a logic circuit that is deployed in one of the areas is instructed to be rewritten to a new logic circuit, the circuit controller deploys the new logic circuit in another of the areas, and, after deployment of the new logic circuit has ended, stops operation of the logic circuit that was initially deployed in the one of the areas.

Supplementary Note 2

A circuit device comprising:

a circuit construction unit having an area in which a logic circuit can be deployed; and a circuit controller configured to deploy a designated logic circuit in the area, wherein, if the logic circuit that is deployed in the area is instructed to be rewritten to a new logic circuit, the circuit controller executes processing to be executed by the logic circuit that was initially deployed, instead of the logic circuit that was initially deployed, and also deploys the new logic circuit in the area, and, after deployment of the new logic circuit has ended, stops executing the processing.

Supplementary note 3

A circuit rewriting method being a method using a circuit device having at least two areas in which a logic circuit can be deployed, the method comprising:

(a) a step, by a processor of the circuit device, of deploying a designated logic circuit in the areas; and (b) a step, by the processor, of, if a logic circuit that is deployed in one of the areas is instructed to be rewritten to a new logic circuit, deploying the new logic circuit in another of the areas, and, after deployment of the new logic circuit has ended, stopping operation of the logic circuit that was initially deployed in the one of the areas.

Supplementary Note 4

A circuit rewriting method being a method using a circuit device having an area in which a logic circuit can be deployed, the method comprising:

(a) a step, by a computer of the circuit device, of deploying a designated logic circuit in the area; and (b) a step, by the computer, of, if the logic circuit that is deployed in the area is instructed to be rewritten to a new logic circuit, executing processing to be executed by the logic circuit that was initially deployed, instead of the logic circuit that was initially deployed, and also deploying the new logic circuit in the area, and, after deployment of the new logic circuit has ended, stopping executing the processing.

Supplementary Note 5

A computer-readable recording medium in which a program is recorded, the program including a command for causing a computer that is provided in a circuit device having at least two areas in which a logic circuit can be deployed to execute:

(a) a step of deploying a designated logic circuit in the areas; and (b) a step of, if a logic circuit that is deployed in one of the areas is instructed to be rewritten to a new logic circuit, deploying the new logic circuit in another of the areas, and, after deployment of the new logic circuit has ended, stopping operation of the logic circuit that was initially deployed in the one of the areas.

Supplementary Note 6

A computer-readable recording medium in which a program is recorded, the program including a command for causing a computer that is provided in a circuit device having an area in which a logic circuit can be deployed to execute:

(a) a step of deploying a designated logic circuit in the area; and (b) a step of, if the logic circuit that is deployed in the area is instructed to be rewritten to a new logic circuit, executing processing to be executed by the logic circuit that was initially deployed, instead of the logic circuit that was initially deployed, and also deploying the new logic circuit in the area, and, after deployment of the new logic circuit has ended, stopping executing the processing.

Although the present invention was described with reference to the embodiments, the present invention is not limited to the above-described embodiments. Various modifications that can be understood by those skilled in the art can be made to the configuration and details of the present invention within the scope of the invention.

This application claims priority to Japanese Patent Application No. 2016-090727 filed Apr. 28, 2016, the entire contents of which are incorporated herein by reference.

INDUSTRIAL APPLICABILITY

As described above, according to the present invention, it is possible to execute rewriting of a logic circuit without stopping processing in an FPGA. The present invention is useful for FPGAs in particular.

REFERENCE NUMERALS

10 Circuit device (Embodiment 1)
20 Circuit construction unit
21, 22 Logic circuit deployment area
30 Circuit controller
40 Recording medium
50 Circuit device (Embodiment 2)
60 Circuit construction unit
61 Logic circuit deployment area
70 Circuit controller
110 Computer
111 CPU
112 Main memory
113 Bus
114 Input interface
115 Data reader

What is claimed is:

1. A circuit device comprising:
a circuit construction unit having an area; and
a circuit controller configured to deploy a designated logic circuit in the area,
wherein, in a case where a first logic circuit is deployed in the area when the circuit controller obtains an instruction for deploying a second logic circuit in the area, the circuit controller takes over and executes processing to be executed by the first logic circuit instead of the first logic circuit in the area, and also deploys the second logic circuit in the area, and, after deployment of the second logic circuit has ended, stops execution of the processing to be executed by the first logic circuit.

2. A circuit rewriting method using a circuit device having an area, the method comprising:
(a) a step, by a computer of the circuit device, of deploying a designated logic circuit in the area; and
(b) a step, by the computer, of, in a case where a first logic circuit is deployed in the area when an instruction for deploying a second logic circuit in the area is obtained, taking over and executing processing to be executed by the first logic circuit instead of the first logic circuit in the area, and also deploying the second logic circuit in the area, and, after deployment of the second logic circuit has ended, stopping the executing of the processing to be executed by the first logic circuit.

3. A non-transitory computer-readable recording medium in which a program is recorded, the program including a command for causing a computer that is provided in a circuit device having an area to execute:
(a) a step of deploying a designated logic circuit in the area; and
(b) a step of, in a case where a first logic circuit is deployed in the area when an instruction for deploying a second logic circuit in the area is obtained, taking over and executing processing to be executed by the first logic circuit, instead of the first logic circuit in the area, and also deploying the second logic circuit in the area, and, after deployment of the second logic circuit has ended, stopping the executing of the processing to be executed by the first logic circuit.

* * * * *